(12) United States Patent
Kakiuchi et al.

(10) Patent No.: US 7,362,189 B2
(45) Date of Patent: Apr. 22, 2008

(54) OSCILLATOR CIRCUIT WITH REGULATED V-I OUTPUT STAGE

(75) Inventors: Takao Kakiuchi, Kyoto (JP); Takeshi Wakii, Kyoto (JP); Sho Maruyama, Kyoto (JP)

(73) Assignee: Rohm Co., Ltd. (JP)

( * ) Notice: Subject to any disclaimer, the term of this patent is extended or adjusted under 35 U.S.C. 154(b) by 0 days.

(21) Appl. No.: 10/857,276

(22) Filed: May 28, 2004

(65) Prior Publication Data

US 2005/0275468 A1 Dec. 15, 2005

(51) Int. Cl.
*H03K 3/03* (2006.01)

(52) U.S. Cl. ............................ 331/74; 331/57; 327/103
(58) Field of Classification Search .................. 331/57, 331/74, 177 R; 327/103
See application file for complete search history.

(56) References Cited

U.S. PATENT DOCUMENTS

| | | | |
|---|---|---|---|
| 5,426,398 A * | 6/1995 | Kuo | ............................ 331/57 |
| 5,428,318 A | 6/1995 | Razavi | |
| 5,585,754 A | 12/1996 | Yamashina et al. | |
| 6,198,356 B1 * | 3/2001 | Visocchi et al. | ............... 331/34 |
| 6,229,403 B1 * | 5/2001 | Sekimoto | ...................... 331/57 |
| 6,958,631 B2 * | 10/2005 | Aiba et al. | .................. 327/112 |

FOREIGN PATENT DOCUMENTS

| | | |
|---|---|---|
| JP | 63-254814 | 10/1988 |
| JP | 1-305722 | 12/1989 |
| JP | 06-037599 | 2/1994 |
| JP | 08-102646 | 4/1996 |
| JP | 9-36708 | 2/1997 |
| JP | 10-13210 | 1/1998 |
| JP | 10-22794 | 1/1998 |
| JP | 11-017501 | 1/1999 |
| JP | 11-88126 | 3/1999 |
| JP | 2000-59181 A | 2/2000 |
| JP | 2000-244285 | 9/2000 |
| JP | 2001-177380 | 6/2001 |
| JP | 2001-217695 A | 8/2001 |
| JP | 2002-223149 A | 8/2002 |
| JP | 2003-188688 | 7/2003 |
| WO | WO 2004/107575 | 12/2004 |

OTHER PUBLICATIONS

Japanese Office Action for Patent Application No. 2003-150326 dated Aug. 22, 2006 with an English translation.

(Continued)

*Primary Examiner*—Robert J. Pascal
*Assistant Examiner*—James Goodley
(74) *Attorney, Agent, or Firm*—Cantor Colburn LLP

(57) ABSTRACT

A voltage controlled current source outputs oscillator drive current and oscillator equivalent current. A signal oscillator outputs first source oscillation signal and second source oscillation signal. A differential amplifier outputs first amplification oscillation signal and second amplification oscillation signal. First switch circuit and second switch circuit output first current oscillation signal and second current oscillation signal, respectively. A first current value converter-amplifier circuit converts a value of the first current oscillation signal whereas a second current value converter-amplifier circuit converts a value of the second current oscillation signal, so that the thus converted values become output current finally. An adder outputs to the differential amplifier a differential amplifier drive current in which equivalent current for use with conversion is added up with the oscillator equivalent current outputted from the voltage controlled current source.

6 Claims, 4 Drawing Sheets

OTHER PUBLICATIONS

B. Razavi, "Design of Analog CMOS Integrated Circuits" (McGraw-Hill, 2001) with English translation.

Japanese Office Action dated Sep. 11, 2007 with an English translation; Patent Application No. 2005-298037.

* cited by examiner

OSCILLATOR CIRCUIT WITH REGULATED V-I OUTPUT STAGE

BACKGROUND OF THE INVENTION

1. Field of the Invention

The present invention relates to oscillators, and it particularly relates to an oscillator in which the frequency of oscillation can be varied.

2. Description of the Related Art

A voltage controlled oscillator is used in optical pickups or phase-locked loops (PLL), for instance. Generally, an oscillation frequency is adjusted according to a control voltage applied and then a signal of the thus adjusted oscillation frequency is outputted. In an example of a conventional voltage controlled oscillator, an inverting amplifier, a first charge/discharge circuit and a second charge/discharge circuit are electrically coupled to form a circuit. In this structure, the phase of an inverted voltage signal from the inverting amplifier is delayed in stages at the first and the second charge/discharge circuit and the output of the second charge/discharge circuit is again inputted to the inverting amplifier. After a full circle, the phase of an inverted voltage signal returns to the same phase as the original one, so that the voltage controlled oscillator can keep oscillating by repeating the above processing. The oscillation frequency of the voltage controlled oscillator is determined mainly in response to the magnitude of the charge/discharge current at the first and the second charge/discharge circuit, and the magnitude of the charge/discharge current is controlled by an easily controllable control current which has a current value level higher than the charge/discharge current (See, for example, Reference (1) in the following Related Art List).

RELATED ART LIST (1) Japanese Patent Application Laid-Open No. Hei06-37599.

According to such conventional technology, the charge/discharge current, even when it is very small, is controlled by control current, so that stable oscillation output can be achieved even at low oscillation frequencies by stabilizing the level of control current values. At high oscillation frequencies, however, there are generally the following problems to be solved. For example, when an oscillation signal at a high oscillation frequency is to be generated and to be further amplified by a field effect transistor (FET) (hereinafter referred to as "amplifying FET"), any small current to the amplifying FET slows the clock rate of the amplifying FET, which results in an inadequate amplification of the oscillation signal. Yet such an arrangement as to send a large current to an amplifying FET in order to adequately amplify an oscillation signal at a high oscillation frequency may lead to the consumption of more than necessary power when an oscillation signal at a low oscillation frequency, instead of a high oscillation frequency, is to be amplified.

Furthermore, suppliers of oscillators incorporated into LSIs (large-scale integrated circuits) find it desirable if such LSIs can be mass-produced for general-purpose uses. And users of LSIs to be built into their equipment require that signal output at a sufficient amplitude be produced at an oscillation frequency set in the equipment and desire that the oscillator operates at low power consumption. Accordingly, an oscillator is expected to provide desired characteristics of signal output in a wide range of oscillation frequencies and power consumption. Particularly when the user uses an oscillator in a certain equipment, in which the oscillation frequency changes according to predetermined settings during its operation, certain requirements must be met as to the signal outputs relative to the respective oscillation frequencies and the power consumption.

SUMMARY OF THE INVENTION

The present invention has been made in view of the foregoing circumstances and an object thereof is to provide an oscillator with improved characteristics of oscillation signals relative to oscillation frequencies and lowered power consumption.

A preferred embodiment according to the present invention relates to an oscillator. This oscillator includes: an oscillation signal generating circuit of differential type which sets an oscillation frequency of an oscillation signal and outputs as a differential signal the oscillation signal whose oscillation frequency has been set; a differential amplifier which differentially amplifies the oscillation signal that has been outputted as the differential signal; a converter-amplifier circuit which converts voltage of the thus differentially amplified oscillation signal into current and amplifies the current; and a frequency-dependent adjusting circuit which adjusts operating characteristics of the differential amplifier according to a condition set in the oscillating signal generating circuit of differential type.

The amplification factor in a "differential amplifier" may be set as appropriate in accordance with a circuit and, for example, a setting range includes cases where the amplification factor is greater than "1", equal to "1" and less than "1".

A "setting condition" or a "condition set in an oscillator" indicates settings on the oscillation frequency, and the setting is done based on a current value, a voltage value or other signals.

When the oscillation frequency of an oscillation signal is set high in the oscillation signal generating circuit of differential type, the frequency-dependent adjusting circuit may raise the clock rate of a differential amplifier.

Setting the oscillation frequency "high" is done in accordance with the magnitude of a voltage value, a current value or a predetermined signal. However, it may suffice that a high oscillation frequency results finally.

By employing the above oscillator, the operating characteristics of a differential amplifier can be adjusted in response to the oscillation frequency of an oscillation signal. Thus, for a higher oscillation frequency, the differential amplifier operates at higher speed, so that an oscillation signal of higher oscillation frequency can be outputted. Furthermore, the oscillator processes differential-type signals, so that distortion components of a signal are offset even at a high oscillation frequency and the distortion components of the signal are reduced.

The oscillation signal generating circuit of differential type may include a ring oscillator of differential type and a drive circuit which delivers to the ring oscillator of differential type a driving current subject to the setting condition, and the frequency-dependent adjusting circuit may operate on the differential amplifier by delivering to the differential amplifier a current according to the drive current.

Another preferred embodiment according to the present invention relates also to an oscillator. This oscillator includes: an oscillation signal generating circuit of differential type which outputs a predetermined oscillation signal as a differential signal; a differential amplifier which differentially amplifies the oscillation signal that has been outputted as the differential signal; a converter-amplifier circuit which converts voltage of the thus differentially amplified oscillation signal into current and amplifies the current; a setting circuit which sets a conversion characteristic of the converter-amplifier circuit; and an output-dependent adjusting circuit which adjusts operating characteristics of the differential amplifier according to a condition set in the setting circuit.

When current for which voltage of oscillation signal is to be converted into current is set large in the setting circuit, the output-dependent adjusting circuit may raise a clock rate of the differential amplifier.

By employing the above oscillator, the operating characteristics of a differential amplifier can be adjusted in accordance with the setting by which to covert the voltage of an oscillation signal into the current. Thus, for example, with a high-speed operation of the differential amplifier, the current of the oscillation signal can be made larger and then outputted.

It is to be noted that any arbitrary combination of the above-described structural components and expressions changed between a method, an apparatus, a system, a computer program, a recording medium having stored computer programs therein, a data structure and so forth are all effective as and encompassed by the present embodiments.

Moreover, this summary of the invention does not necessarily describe all necessary features so that the invention may also be sub-combination of these described features.

DETAILED DESCRIPTION OF THE INVENTION

The invention will now be described based on the following embodiments which do not intend to limit the scope of the present invention but exemplify the invention. All of the features and the combinations thereof described in the embodiments are not necessarily essential to the invention.

First Embodiment

A first embodiment relates to a high-frequency oscillator so structured that a manufacturer can mass-produce a general-purpose version capable of generating oscillation signals in a wide range of oscillation frequencies and moreover a user can set predetermined oscillation frequencies for such a circuit before incorporating it into predetermined equipment. A high-frequency oscillator according to the present embodiment changes the oscillation frequency of an oscillation signal in response to applied control voltage. For example, the circuit raises the oscillation frequency in response to a higher control voltage and lowers it in response to a lower control voltage. Also, the amplitude of the voltage of an oscillation signal is sufficiently amplified by an amplifying FET, and the voltage of the amplified oscillation signal is converted into a current. In particular, a high-frequency oscillator according to this embodiment, which increases the amount of current flowing to the amplifying FET for a higher setting of control voltage, can operate the amplifying FET at high speed when the oscillation frequency is high. On the other hand, when the oscillation frequency is low, this high-frequency oscillator can reduce the amount of current flowing to the amplifying FET, so that the power consumption can be reduced.

Figure 1:
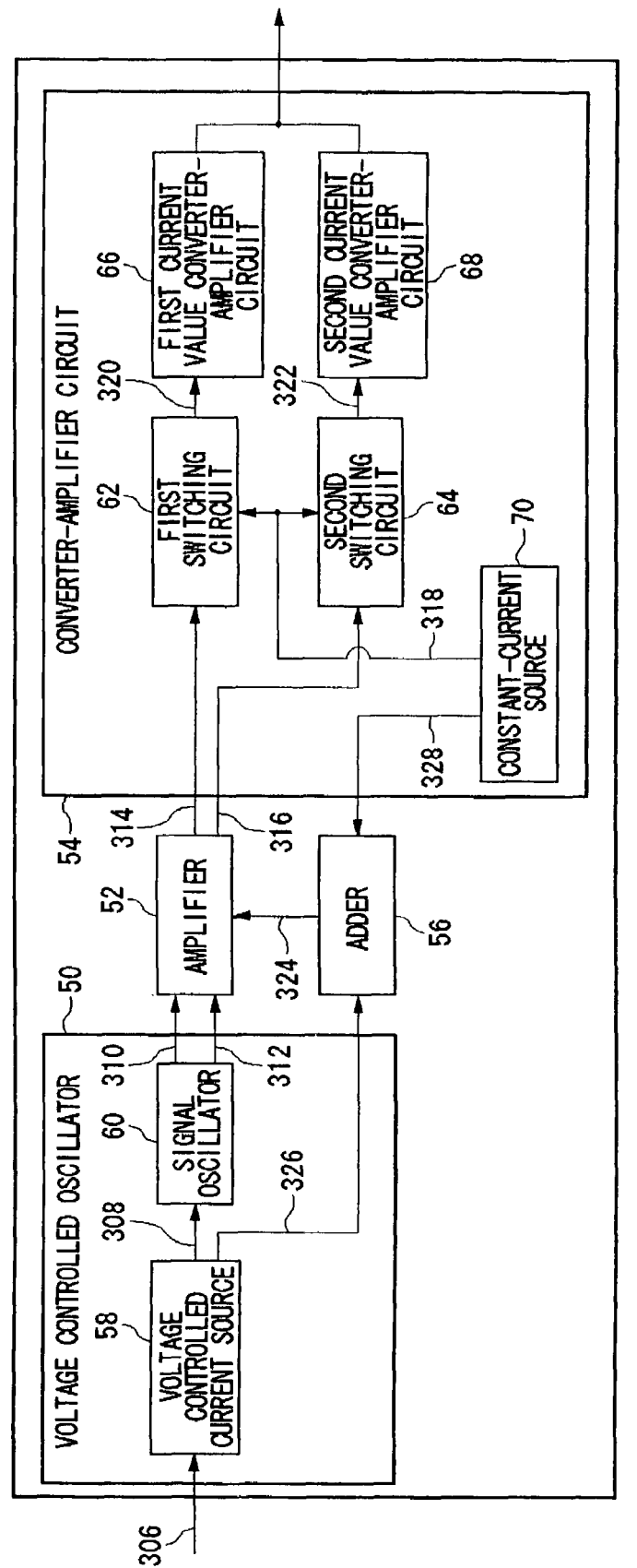
FIG. 1 illustrates a high-frequency oscillator according to a first embodiment of the present invention.

FIG. 1 illustrates a high-frequency oscillator 100 according to the first embodiment of the present invention. The high-frequency oscillator 100 includes a voltage controlled oscillator 50, an amplifier 52, a converter-amplifier circuit 54 and an adder 56. The voltage controlled oscillator 50 includes a voltage controlled current source 58 and a signal oscillator 60, and the converter-amplifier circuit 54 includes a first switching circuit 62, a second switching circuit 64, a first current value converter-amplifier circuit 66, a second current value converter-amplifier circuit 68 and a constant-current source 70. Also included as the signal are control voltage 306, oscillator drive current 308, first source oscillation signal 310, second source oscillation signal 312, first amplification oscillation signal 314, second amplification oscillation signal 316, conversion constant-current 318, first current oscillation signal 320, second current oscillation signal 322, amplifier drive current 324, oscillator equivalent current 326 and conversion equivalent-current 328.

The voltage controlled current source 58 applies a control voltage 306 and sends an oscillator drive current 308 and an oscillator equivalent current 326 in response to the magnitude of the control voltage 306. Here, the magnitudes of oscillator drive current 308 and oscillator equivalent current 326, which are related in proportion to each other, both increase with the rise in the control voltage 306.

The signal oscillator 60 outputs a first source oscillation signal 310 and a second source oscillation signal 312 at an oscillation frequency corresponding to the magnitude of the oscillator drive current 308. More specifically, a higher oscillation frequency is set for a larger oscillator drive current 308. The first source oscillation signal 310 and the second source oscillation signal 312, which present the maximum value and the minimum value repeatedly within a certain period at constant intervals as with a sinusoidal wave, both constitute a balanced signal so as to enable a differential amplification at an amplifier 52 to be explained later. It is to be noted that a "balanced signal" herein indicates a differential signal whereas an "unbalanced signal" herein indicates a normal signal based on ground or the like.

The amplifier 52 differentially amplifies the first source oscillation signal 310 and the second source oscillation signal 312, respectively, and outputs a first amplification oscillation signal 314 and a second amplification oscillation signal 316. This differential amplification is carried out in order to increase drive capacity at the first switching circuit 62 and the second switching circuit 64 to be described later. The first amplification oscillation signal 314 and the second amplification oscillation signal 316 have the same waveforms as the first source oscillation signal 310 and the second source oscillation signal 312 and constitute balanced signals. It is to be noted that the aforementioned amplifying FET is included in the amplifier 52.

The constant-current source 70 supplies a conversion constant-current 318 with which the voltages of the first amplification oscillation signal 314 and the second amplification oscillation signal 316 are converted into the respective currents thereof. Here the conversion constant-current 318 is regulated to a constant value, and the constant-current source 70 also outputs a conversion equivalent-current 328, which has a proportional relation with the conversion constant-current 318.

The first switching circuit 62 converts a first amplification oscillation signal 314 into a first current oscillation signal 320. Here, for a larger value of first amplification oscillation signal 314, the value of first current oscillation signal 320 gets closer to the value of conversion constant-current 318. And, for a smaller value of first amplification oscillation signal 314, the value of first current oscillation signal 320 becomes smaller. The second switching circuit 64 operates the same way as the first switching circuit 62, thereby converting a second amplification oscillation signal 316 into a second current oscillation signal 322.

The first current value converter-amplifier circuit 66 converts the value of a first current oscillation signal 320 whereas the second current value converter-amplifier circuit 68 converts the value of a second current oscillation signal 322. Here, the converted first current oscillation signal 320 corresponds to a source current, and the converted second current oscillation signal 322 corresponds to a sink current. And based on the switching at the first switching circuit 62 and the second switching circuit 64, the sink current and the source current become an output current. Here, the "output current" is to be understood to contain the "sink current" and "source current".

The adder 56 causes an amplifier drive current 324, which is the sum of an oscillator equivalent current 326 and a conversion equivalent-current 328, to flow to the amplifier 52. The larger the amplifier drive current 324 is, the faster the operation of the amplifier 52 will be. In other words, even when the first source oscillation signal 310 and the second source oscillation signal 312 fluctuate at higher frequencies, the amplifier drive current 324 becomes larger, so that the operation of the amplifier 52 can follow the higher oscillation frequencies and also the amplitude of the first amplification oscillation signal 314 and the second amplification oscillation signal 316 becomes larger.

Moreover, though the details will be explained in a second embodiment later, an amplifier drive current 324 is also a result of the addition of an equivalent current 328 for use with conversion, so that even when the amplitude of a first amplification oscillation signal 314 and a second amplification oscillation signal 316 becomes larger, the amplitude of a first current oscillation signal 320 and a second current oscillation signal 322 becomes larger, too, irrespective of the value of the conversion constant-current 318.

Figure 2:
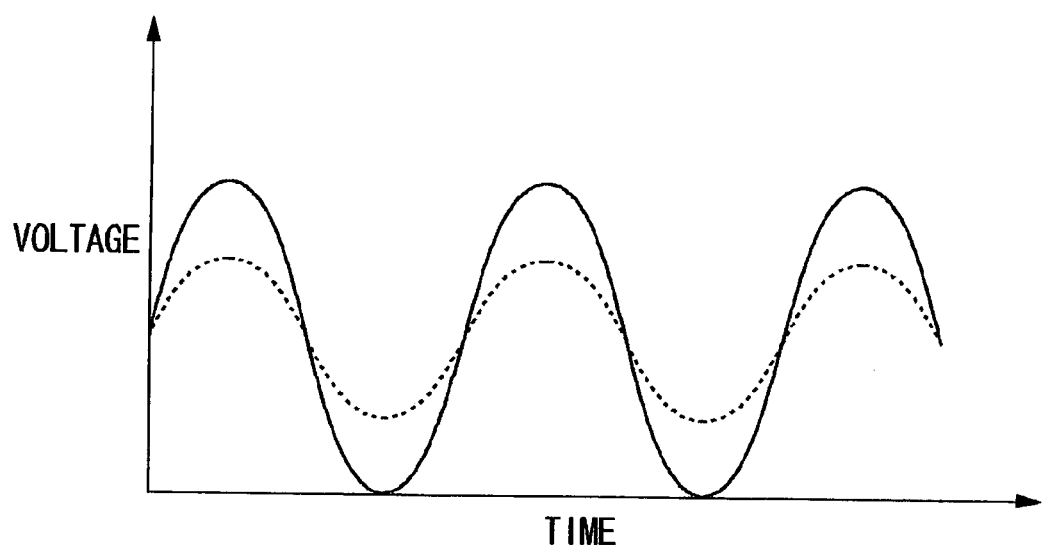
FIG. 2 shows output signals of an amplifier shown in FIG. 1.

FIG. 2 illustrates changes with time of a first amplification oscillation signal 314 as an output signal from an amplifier 52. While the solid line in FIG. 2 shows a case where the amplifier drive current 324 is sufficiently large, the dotted line therein shows a case where the amplifier drive current 324 is small. For a large amplifier drive current 324, the operation of the amplifier 52 can adequately follow the variation in a first source oscillation signal 310 at a high oscillation frequency, so that the amplitude of the first amplification oscillation signal 314 will also become larger. On the other hand, for a small amplifier drive current 324, the operation of the amplifier 52 cannot adequately follow the variation in a first source oscillation signal 310, so that the amplitude of the first amplification oscillation signal 314 will become smaller. The same goes for the second amplification oscillation signal 316 as well.

Figure 3:
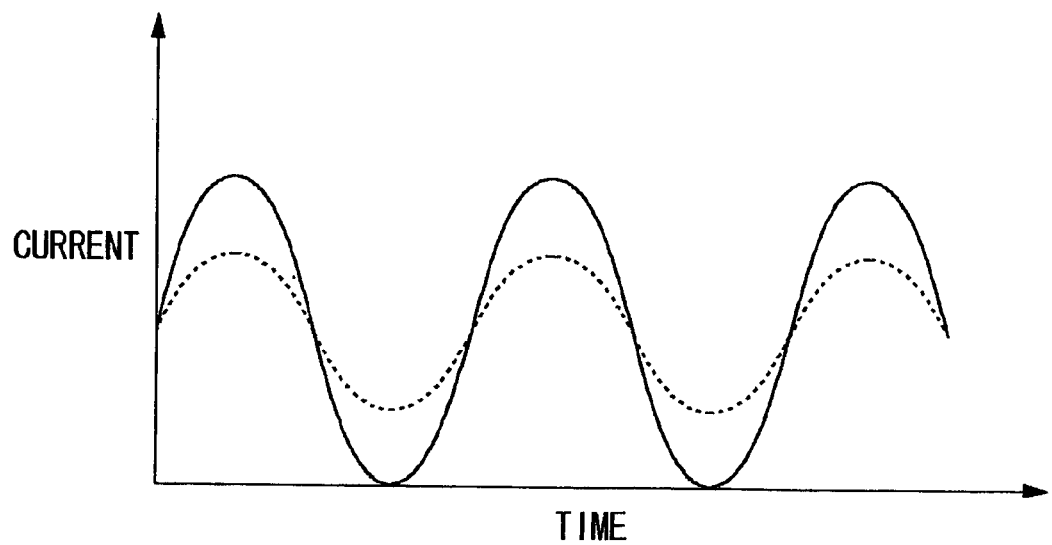
FIG. 3 shows output currents produced through conversion from voltage by a converter-amplifier circuit shown in FIG. 1.

FIG. 3 illustrates two cases of output current produced through conversion from voltage by a converter-amplifier circuit 54. While the solid line in FIG. 3 shows a case where the amplitude of a first amplification oscillation signal 314 and a second amplification oscillation signal 316 is large, the dotted line therein shows a case where the amplitude of a first amplification oscillation signal 314 and a second amplification oscillation signal 316 is small. Assumed as a case where the amplitude of a first amplification oscillation signal 314 and a second amplification oscillation signal 316 is small is, for instance, a case where a conversion equivalent-current 328 is not added to an amplifier drive current 324. For a large amplitude of a first amplification oscillation signal 314 and a second amplification oscillation signal 316, the switching at the first switching circuit 62 and the second switching circuit 64 is performed at high speed, thus adequately carrying out conversion into a first current oscillation signal 320 and a second current oscillation signal 322. As a result, the amplitude of an output current after conversion by the converter-amplifier circuit 54 will become large, too. On the other hand, for a small amplitude of a first amplification oscillation signal 314 and a second amplification oscillation signal 316, conversion into a first current oscillation signal 320 and a second current oscillation signal 322 is not carried out adequately. As a result, the amplitude of an output current after conversion by the converter-amplifier circuit 54 will become small.

The "amplitude of output current" may be defined by the sum of the maximum values of sink current and source current, the maximum value of sink current, the maximum value of source current, or the like. For the purpose of this embodiment, however, they are not expressly distinguished from one another.

A high-frequency oscillator 100 according to the present embodiment is structured such that a voltage controlled oscillation circuit 50 and an amplifier 52 transmit a balanced signal of voltage based on the differential amplification processing and the balanced signal is finally converted into an unbalanced signal of current by a converter-amplifier circuit 54. A structure like this allows the offsetting of distortion components of signals between the balanced signals, so that the reduced distortion components of the signals result in a reduction in the harmonic components of EMI (electromagnetic interference). Hence, the high-frequency oscillator 100 can output signals that do not contain any undesirable amount of harmonic components.

A high-frequency oscillator 100 of a structure as described above operates as follows. When a control voltage 306 is raised higher, an oscillator drive current 308 and an oscillator equivalent current 326 both sent out from a voltage controlled current source 58 become larger. For a larger oscillator drive current 308, a signal oscillator 60 outputs a first source oscillation signal 310 and a second source oscillation signal 312 at a higher oscillation frequency. When an oscillator equivalent current 326 becomes larger, an amplifier drive current 324 flowing from an adder 56 also becomes larger. For a larger amplifier drive current 324, the amplifier 52 amplifies the first source oscillation signal 310 and the second source oscillation signal 312 at the higher oscillation frequency into a first amplification oscillation signal 314 and a second amplification oscillation signal 316 of a sufficiently large amplitude, respectively.

A first switching circuit 62 and a second switching circuit 64 convert a first amplification oscillation signal 314 and a second amplification oscillation signal 316 into a first current oscillation signal 320 and a second current oscillation signal 322, respectively, based on a conversion constant-current 318 sent from a constant-current source 70. A first current value converter-amplifier circuit 66 and a second current value converter-amplifier circuit 68 convert the values of a first current oscillation signal 320 and a second current oscillation signal 322, respectively, and finally produce an output current according to the switching at the first switching circuit 62 and the second switching circuit 64. It is to be noted here that since an amplifier drive current 324, after the addition of a conversion equivalent-current 328 from the constant-current source 70, is supplied to the amplifier 52 irrespective of the magnitude of the control voltage 306, the amplitude of the first current oscillation signal 320 and the second current oscillation signal 322 converted at the first switching circuit 62 and the second switching circuit 64 becomes closer to the value of the conversion constant-current 318.

According to the present embodiment, a current in response to the oscillation frequency of an oscillation signal is delivered to an amplifier. Therefore, when the oscillation frequency is high, the amplitude of the output current can be made larger, and when the oscillation frequency is low, operation at low power consumption can be realized. Furthermore, a current in proportion to a current used for converting the voltage of an oscillation signal into a current is sent to the amplifier. Accordingly, switching at the amplifier is carried out faster, which enables an amplification of an oscillation signal to a voltage with larger amplitude, thus realizing a larger amplitude for the output current.

Second Embodiment

A high-frequency oscillator according to a second embodiment is a circuit similar to that of the first embodiment. Though a high-frequency oscillator is explained using function blocks in the first embodiment, a high-frequency oscillator according to the second embodiment will be explained with a circuit configuration such as an FET.

Figure 4:
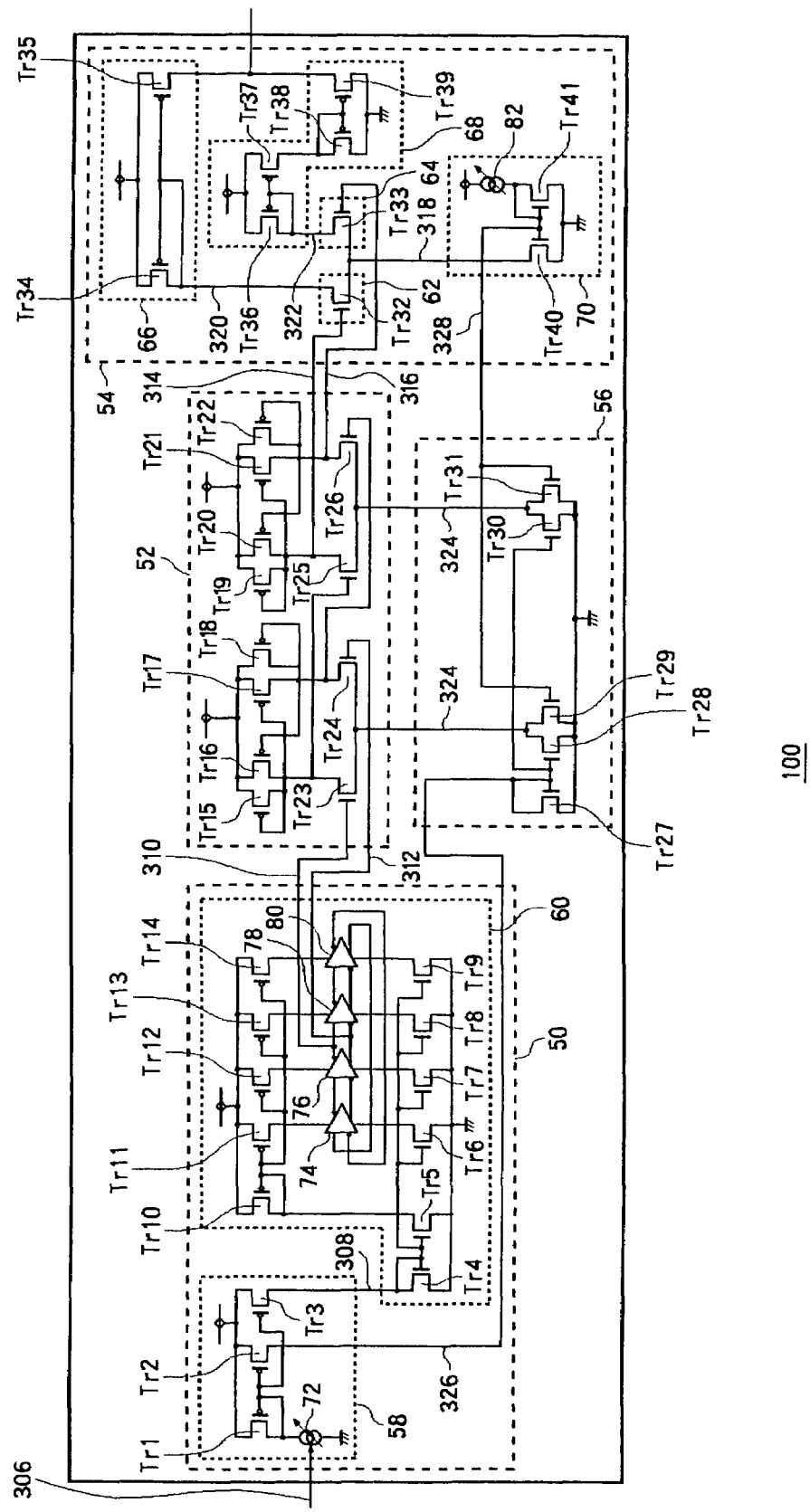
FIG. 4 illustrates a high-frequency oscillator according to a second embodiment of the present invention.

FIG. 4 shows a high-frequency oscillator 100 according to a second embodiment of the present invention. It is to be noted here that the same function blocks and signals in FIG. 4 as those in FIG. 1 are given the same reference numerals as in FIG. 1.

A variable current source 72 delivers a current that varies according to a controlled voltage 306. Transistors Tr1, Tr2 and Tr3 constitute a current mirror circuit. The oscillator equivalent current 326 is delivered from the transistor Tr2 whereas the oscillator drive current 308 is delivered from the transistor Tr3. As described above, the oscillator drive current 308, the oscillator equivalent current 326 and the current from the variable current source 72 are mutually proportional to one another.

Transistors Tr4 to Tr9 constitute a current mirror circuit, and transistors Tr10 to Tr14 constitute also a current mirror circuit. With these current mirror circuits, current in response to the oscillator drive current 308 is sent to ring oscillators of differential output type which are constituted respectively by first inverter 74, second inverter 76, third inverter 78 and fourth inverter 80. That is, when the oscillator drive current 308 becomes large, the current delivered to the ring oscillator becomes large. As a result, the oscillation frequency of the first source oscillation signal 310 and the second source oscillation signal 312 outputted from the ring oscillator increases.

Transistors Tr15 to Tr18, transistor Tr23 and transistor Tr24 constitute a differential amplifier, so that the first source oscillation signal 310 and the second source oscillation signal 312 are applied to gate terminal of transistor Tr23 and gate terminal of transistor Tr24, respectively, where a differential amplifying processing is performed. Similar to the first embodiment, the purpose of this differential amplifying processing is to raise a drive capacity at a transistor Tr32 or Tr33 described later. Transistors Tr19 to Tr22, transistor Tr25 and transistor Tr26 constitute also a differential amplifier. Thus, the first source oscillation signal 310 and the second source oscillation signal 312 are amplified in two stages and are outputted as a first amplification oscillation signal 314 and a second amplification oscillation signal 316, respectively. Amplifier drive currents 324 sent to the respective differential amplifiers will be described later.

Transistors Tr41 and Tr40 constitute a current mirror circuit, and this current mirror circuit delivers the conversion constant-current 318 of a constant value from a variable current source 82 and the conversion equivalent-current 328 proportional to the conversion constant-current 318.

A transistor Tr32 converts the first amplification oscillation signal 314 applied to the gate terminal thereof into the first current oscillation signal 320. Here, the transistor Tr32 is of an n-channel type. Hence, when the value of the first amplification oscillation signal 314 becomes large, the value of the first current oscillation signal 320 also gets close to that of the conversion constant-current 318. A transistor Tr33 operates the same way as the transistor Tr32 and converts the second amplification oscillation signal 316 applied to the gate terminal thereof into the second current oscillation signal 322. Transistors Tr34 and Tr35 constitute a current mirror circuit and this current mirror circuit converts a first current oscillation signal 320 into a first output current which is proportional to the first current oscillation signal 320. Transistors Tr36 and Tr37 and transistors Tr38 and Tr39 constitute current mirror circuits, respectively, and these current mirror circuits convert a second current oscillation signal 322 into a second output current which is proportional to the second current oscillation signal 322. The first and the second output current become finally an output current by switching between the transistor Tr32 and the transistor Tr33.

Transistors Tr27, Tr28 and Tr30 constitute a current mirror circuit, and the amplifier drive currents 324 proportional to the oscillator equivalent current 326 are delivered from the transistor Tr28 and the transistor Tr30. As described above, when the oscillator equivalent current 326 becomes large, the amplifier drive current 324 becomes large in response thereto.

The reason why the current proportional to the conversion equivalent-current 328 is added to the amplifier drive current 324 is as follows. It is necessary to make the conversion constant-current 318 large in order to make large the amplitude of the final output current. However, if gate-source voltage of the transistor Tr32 and the transistor Tr33 is low, the switching operation of the transistor Tr32 and the transistor Tr33 will be slow. As a result, the amplitude of the conversion constant-current 318 will be small and the conversion constant-current 318 is not efficiently converted into the amplitude of the first current oscillation signal 320 and the second current oscillation current 322. Thus, the conversion equivalent-current 328 which is in a predetermined relation to the conversion constant-current 318 is caused to flow and then the current delivered from a current mirror circuit constituted by transistors Tr41, Tr31 and Tr29 is added to the amplifier drive current 324.

Thereby, the amplifier drive current 324 flowing to the differential amplifier becomes larger, so that the operating characteristics of the differential amplifier become faster. Hence, the faster operating characteristics can follow the variation in the first source oscillation signal 310 and the second source oscillation signal 312, so that the amplitude of the first amplification oscillation signal 314 and the second amplification oscillation signal 316 becomes sufficiently large. As a result, the maximum value of gate-source voltage in the transistor Tr32 and the transistor Tr33 becomes larger and the switching operation of the transistor Tr32 and the transistor Tr33 becomes faster. Hence, the conversion constant-current 318 can be efficiently conveyed to the amplitude of the final output current.

FIG. 2 illustrates changes with time of a first amplification oscillation signal 314 or a second amplification oscillation signal 316 as an output signal from the amplifier 52. FIG. 3 shows the output current which is converted from voltage by the converter-amplifier circuit 54. Detail description therefor is omitted here for they are identical to the first embodiment.

A high-frequency oscillator 100 of a structure as described above operates as follows. When a control voltage 306 is raised higher, an oscillator equivalent current 326 sent from the transistor Tr2 and an oscillator drive current 308 sent from the transistor Tr3 in a current mirror circuit become larger. For a larger oscillator drive current 308, the oscillation frequencies of a first source oscillation signal 310 and a second source oscillation signal 312 which are outputted from the first inverter 74, second inverter 76, third inverter 78 and fourth inverter 80 become higher. When an oscillator equivalent current 326 becomes larger, an amplifier drive current 324 flowing from the transistor Tr28 and the transistor Tr30 in a current mirror circuit also becomes larger. For a larger amplifier drive current 324, the amplifier 52 amplifies the first source oscillation signal 310 and the second source oscillation signal 312 at the higher oscillation frequency into a first amplification oscillation signal 314 and a second amplification oscillation signal 316 of a sufficiently large amplitude, respectively.

A transistor Tr32 and a transistor Tr33 convert a first amplification oscillation signal 314 and a second amplification oscillation signal 316 into a first current oscillation signal 320 and a second current oscillation signal 322, respectively, based on a conversion constant-current 318 sent from a transistor Tr40 in a current mirror circuit. The transistor Tr35 in a current mirror circuit converts the value of a first current oscillation signal 320 whereas the transistor Tr39 in another current mirror circuit converts the value of a second current oscillation signal 322. The thus converted current becomes finally an output current according to the switching at the transistor Tr32 and the transistor Tr33. It is to be noted here that since an amplifier drive current 324, after the addition of a conversion equivalent-current 328, is supplied by the transistor Tr31 and the transistor Tr29 irrespective of the magnitude of the control voltage 306, the gate-source voltage in the transistor Tr32 and transistor Tr33 also becomes high, so that the amplitude of the first current oscillation signal 320 and the second current oscillation signal 322 becomes closer to the value of the conversion constant-current 318.

According to the present embodiment, when the control voltage is raised, the oscillation frequency of an oscillation signal becomes higher and the transistors in a differential amplifier operate at higher speed. Thus, the amplitude of the output current can be made larger. On the other hand, when the oscillation frequency is low, the transistors can be operated at low power consumption. Furthermore, a current in proportion to that used for the transistors with which the voltage of an oscillation signal is converted into a current is sent to the transistors in the differential amplifier. Thus, the transistors in the differential amplifier operate at high speed and the amplitude of the oscillation signal becomes larger. As a result, the voltage of oscillation signal can be efficiently converted into currents.

Third Embodiment

In this third embodiment, a structure of apparatus or LSI to which a high-frequency oscillator according to the first or second embodiment is implemented or applied will be described.

Figure 5A:
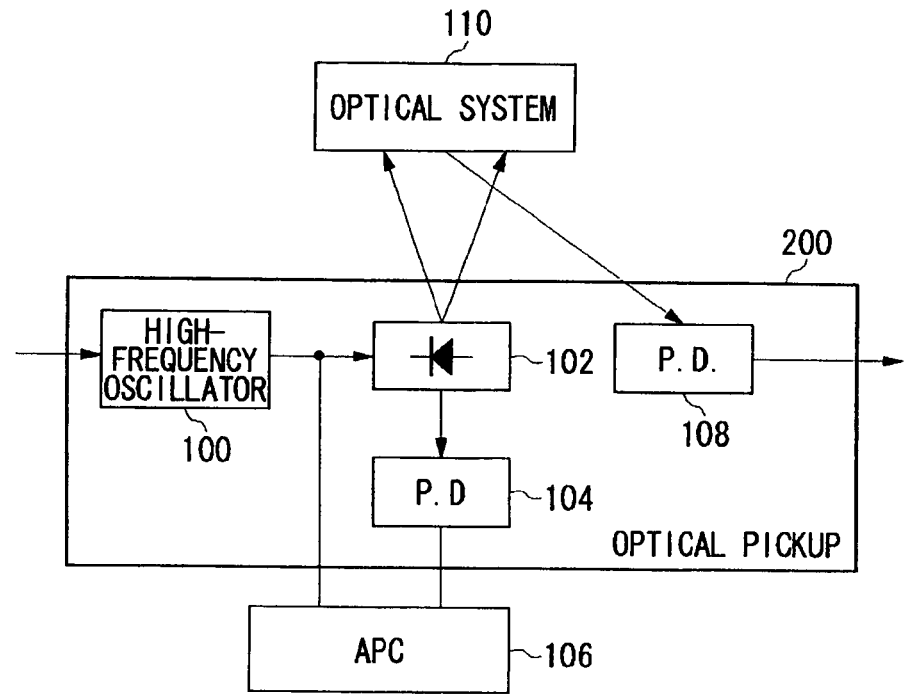
FIGS. 5A, 5B and 5C illustrate applied examples of high-frequency oscillators according to a third embodiment of the present invention.

FIG. 5A illustrates a structure of an optical pickup 200 among applied examples of the high-frequency oscillator 100 according to the third embodiment. The optical pickup 200 includes a high-frequency oscillator 100, a semiconductor laser chip 102, a photodiode 104 for use with a monitor and a light receiving photodiode 108. The optical pickup 200 reads signals out of or write them to a disk, which is a recording medium, in information record/reproduce equipment such as an optical disk device or magneto-optical disk unit.

The semiconductor laser chip 102 emits laser beams in response to current supplied from a high-frequency oscillator 100 described later. Based on a control signal indicated by voltage from an automatic power control (APC) circuit described later, the high-frequency oscillator 100 supplies currents to the semiconductor laser chip 102.

An optical system 110 irradiates a disk (not shown), which is a recording medium, as a light spot, with a laser beam emitted from the semiconductor laser chip 102 and directs light reflected from the disk to the light receiving photodiode 108 described later.

The light receiving photodiode 108 converts the reflected light into current signals. Then the current signal is further converted into a voltage signal. The photodiode 104 for a monitor converts part of laser beams emitted from the semiconductor laser chip 102 into current signals. It is to be noted that "part of laser beams" here are those emitted from a side where the optical system 110 is not provided.

Based on a current signal outputted from the photodiode 104 for a monitor, the APC circuit 106 outputs the control signal to the high-frequency oscillator 100 so that the laser beam is constantly outputted at a constant power from the semiconductor laser chip 102. In other words, the APC circuit 106 performs a feedback control of the semiconductor laser chip 102. The APC circuit 106 is provided for a reason described hereinbelow. The level of voltage signals outputted from the optical pickup 200 needs to be kept at a predetermined level. However, the power of laser beams that the semiconductor laser chips 102 output differs for each chip and is susceptible to the change of temperature. Thus, controlling the semiconductor laser chips 102 in a single uniform way does not result in a constant power of the laser beams, so that the output level of voltage signals cannot be held at a constant level.

As described in the first and second embodiments above, the high-frequency oscillator 100 can make the amplitude of the output current large even at a high frequency. Thus, the semiconductor laser chip 102 can stabilize the emission of laser beams.

Figure 5B:
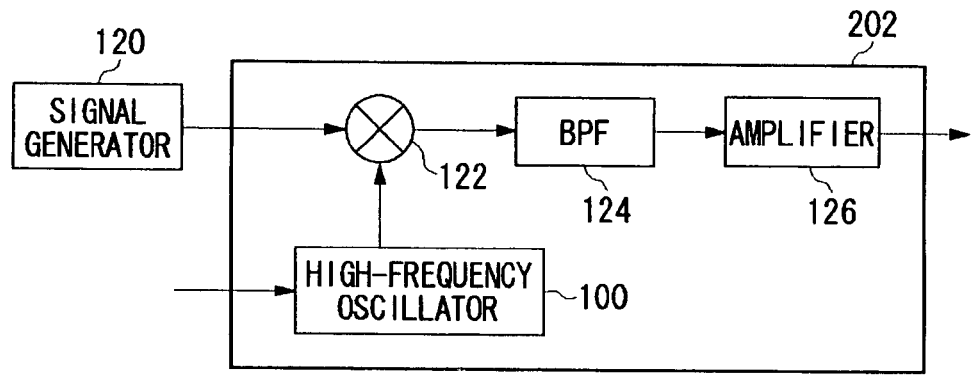

FIG. 5B illustrates a structure of a frequency converter circuit 202 among applied examples of the high-frequency oscillators according to the third embodiment. The frequency converter circuit 202 includes a high-frequency oscillator 100, a multiplier 122, a band-pass filter (BPF) 124 and an amplifier 126. In the communication apparatus the frequency converter circuit 202 converts information to be sent into signals for transmission. More specifically, in the radio transmitting apparatus a baseband signal to be sent or an intermediate frequency signal where the baseband signal is frequency-converted is frequency-converted into a radio frequency signal.

A signal generator 120 generates, as baseband signals, the information to be sent and frequency-converts the generated baseband signals into intermediate frequencies.

The high-frequency oscillator 100 inputs voltage according to the radio frequency used for the transmission and outputs radio frequency signals.

The multiplier 122 frequency-converts the intermediate frequency signals by the radio frequency signals. The BPF 124 reduces the effect of the high frequencies generated by the frequency conversion.

In order to transmit the output signals of BPF 124 on a radio propagation path, the amplifier 126 amplifies them up to a predetermined power.

Here, since the high-frequency oscillator 100 can output the current of a large value even at a high frequency as described in the first and second embodiments above, the semiconductor laser chip 102 can stably output the radio frequency signals.

Figure 5C:
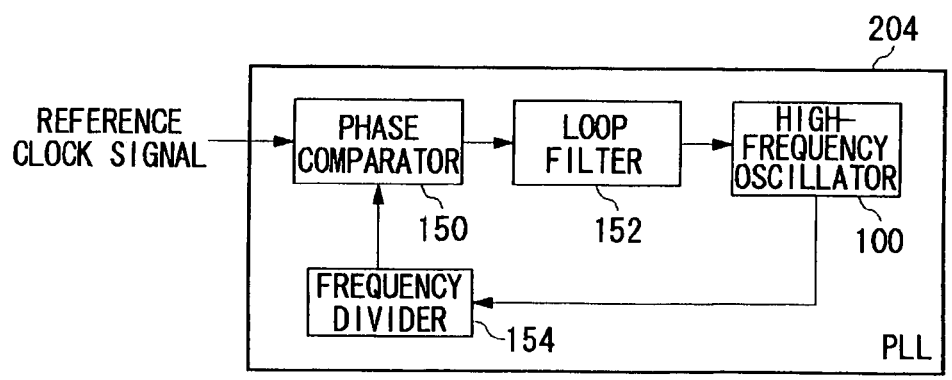

FIG. 5C illustrates a structure of a phase-locked loop (PLL) 204 among applied examples of the high-frequency oscillators according to the third embodiment. The PLL 204 includes a high-frequency oscillator 100, a phase comparator 150, a loop filter 152 and a frequency divider 154.

The phase comparator 150 compares the phase and frequency of a reference clock signal inputted externally with those of a reference clock signal inputted from the frequency divider 154, and outputs a direct-current signal proportional to the difference thereof. The loop filter 152 removes the high-frequency components of inputted signals and outputs a control voltage. The high-frequency oscillator 100 outputs a clock signal having a frequency according to the control voltage inputted. Outputted here is a clock signal having a frequency which is N times the frequency of the reference clock signal. The frequency divider divides the frequency of the outputted clock signal by N so as to be inputted to the phase comparator 150.

According to the present embodiment, the amplitude of output current can be made large even at a high oscillation frequency. And the high-frequency oscillator which can realize the operation at low power consumption even at a low oscillation frequency can be applied to various apparatuses and LSIs.

Next, the structure according to the present embodiments will be described with reference to claim phraseology by way of exemplary component arrangement. An "oscillation signal generating circuit of differential type" corresponds to a variable current source 72 in the voltage controlled current source 58 and transistors Tr1 and Tr3 in a current mirror circuit of the voltage controlled current source 58, and a signal oscillator 60. A "differential amplifier" corresponds to a differential amplifier 52. A "converter-amplifier circuit" corresponds to a converter-amplifier circuit 54. A "frequency-dependent adjusting circuit" corresponds to transistors Tr1 and Tr2 in a current mirror circuit of the voltage controlled current source 58 and transistors Tr27, Tr28 and Tr30 in a current mirror circuit of the adder 56. A "ring oscillator of differential type" corresponds to first inverter 74, second inverter 76, third inverter 78 and fourth inverter 80 in the signal oscillator 60. A "drive circuit" corresponds to transistors TR4 to Tr14 in two current mirror circuits of the signal oscillator 60.

Also, an "oscillation signal generating circuit of differential type" corresponds to a variable current source 72 in the voltage controlled current source and transistors Tr1 and Tr3 in the current mirror circuit thereof and a signal oscillator 60. A "differential amplifier" corresponds to a differential amplifier 52. A "converter-amplifier circuit" corresponds to a converter-amplifier circuit 54. A "setting circuit" corresponds to a constant-current source 70. An "output-dependent adjusting circuit" corresponds to a transistor Tr41 in a current mirror circuit of the constant-current source 70 and transistors Tr31 and Tr29 in current mirror circuits of the adder 56.

The present invention has been described based on the embodiments which are only exemplary. It is therefore understood by those skilled in the art that there exist other various modifications to the combination of each component and process described above and that such modifications are also encompassed by the scope of the present invention.

In the first to third embodiments, the signal oscillator 60, the amplifier 52 and the converter-amplifier circuit 54 are structured by the combination of a plurality of transistors and signals, respectively, and transmit balanced signals in order to perform a differential amplifying processing. However, the purpose is not limited thereto and, for example, unbalanced signals may be transmitted with a purpose of performing an absolute amplifying processing. According to this modified example, the number of parts, such as transistors, that constitute a high-frequency oscillator 100 can be reduced. That is, it suffices that the current with a finally set oscillation frequency oscillates.

In the second embodiment, the amplifier 52 is composed of two differential amplifiers. However, the configuration is not limited thereto and, for example, the amplifier 52 may be constituted by a single differential amplifier or three or more differential amplifiers. According to this modified example, the amplitude of the first amplification oscillation signal 314 and the second amplification oscillation signal 316 can be changed. That is, it suffices that provided is the number of differential amplifiers in response to the values required for the first amplification oscillation signal 314 and the second amplification oscillation signal 316 which are outputted from the amplifier 52.

Although the present invention has been described by way of exemplary embodiments, it should be understood that many changes and substitutions may further be made by those skilled in the art without departing from the scope of the present invention which is defined by the appended claims.

What is claimed is:

1. An oscillator, including:
   an oscillation signal generating circuit of differential type which sets an oscillation frequency of an oscillation signal and outputs as a differential signal the oscillation signal whose oscillation frequency has been set;
   a differential amplifier which differentially amplifies the oscillation signal that has been outputted as the differential signal;
   a converter-amplifier circuit which converts voltage of the thus differentially amplified oscillation signal into an output current which alternates between a sink current and a source current by switching operation; and
   a frequency-dependent adjusting circuit which adjusts operating characteristics of said amplifier according to a condition set in said oscillating signal generating circuit of differential type.

2. An oscillator according to claim 1, wherein when the oscillation frequency of the oscillation signal is set high in said oscillation signal generating circuit of differential type, said frequency-dependent adjusting circuit raises an operation rate of said differential amplifier.

3. An oscillation according to claim 1, wherein said oscillation signal generating circuit of differential type includes a ring oscillator of differential type and a drive circuit which delivers to the ring oscillator of differential type a driving current subject to the setting condition and wherein said frequency-dependent adjusting circuit operates on said differential amplifier by delivering to said differential amplifier a current according to the drive current.

4. An oscillator, including:
- an oscillation signal generating circuit which sets an oscillation frequency of an oscillation signal and outputs the oscillation signal whose oscillation frequency has been set;
- an amplifier which amplifies the oscillation signal that has been outputted from said oscillation signal generating circuit;
- a converter-amplifier circuit which converts voltage of the thus amplified oscillation signal into an output current which alternates between a sink current and a source current by switching operation; and
- a frequency-dependent adjusting circuit which adjusts operating characteristics of said amplifier according to a condition set in said oscillating signal generating circuit.

5. An oscillator according to claim 4, wherein when the oscillation frequency of the oscillation signal is set high in said oscillation signal generating circuit, said frequency-dependent adjusting circuit raises an operation rate of said amplifier.

6. An oscillator according to claim 4, wherein said oscillation signal generating circuit includes a ring oscillator and a drive circuit which delivers to the ring oscillator a driving current subject to the setting condition and wherein said frequency-dependent adjusting circuit operates said amplifier by delivering to said amplifier a current according to the drive current.

* * * * *